United States Patent [19]

McTamaney et al.

[11] Patent Number: 4,483,188
[45] Date of Patent: Nov. 20, 1984

[54] METHOD AND APPARATUS FOR RECORDING AND PLAYBACK OF DYNAGRAPHS FOR SUCKER-ROD WELLS

[75] Inventors: Louis S. McTamaney, Cupertino; Allan B. Delfino, Sunnyvale, both of Calif.; Gary W. Bisbee, Woodlands, Tex.

[73] Assignee: FMC Corporation, Chicago, Ill.

[21] Appl. No.: 470,020

[22] Filed: Apr. 18, 1983

[51] Int. Cl.³ .................. E21B 47/00; H03K 13/22
[52] U.S. Cl. .......................... 73/151; 375/27; 340/347 DD; 346/33 WL
[58] Field of Search .............. 73/151; 364/442; 375/27, 28, 29, 30, 31, 32, 33; 332/11 D; 346/33 WL, 33 M

[56] References Cited
U.S. PATENT DOCUMENTS

| | | | |
|---|---|---|---|
| 3,824,851 | 7/1974 | Hagar et al. | 73/151 |
| 4,143,546 | 3/1979 | Wiener | 73/151 |
| 4,361,893 | 11/1982 | Bonnerot | 375/27 |

*Primary Examiner*—John W. Caldwell, Sr.
*Assistant Examiner*—Ellwood G. Harding, Jr.
*Attorney, Agent, or Firm*—L. B. Guernsey; R. B. Megley

[57] ABSTRACT

Method and apparatus for recording and subsequent playback of selected dynagraphs for wells employing sucker-rod pumping units to determine well faults which cause well shutdown. Calibration data from well monitoring equipment is stored in a first "endless tape" type of memory during calibration of the well and operation data from the monitoring equipment is stored in a second "endless tape" memory during well operation. After well shutdown the stored data can be retrieved and the operation data stored immediately prior to well shutdown compared with calibration data to determine what type of fault caused well shutdown.

11 Claims, 17 Drawing Figures

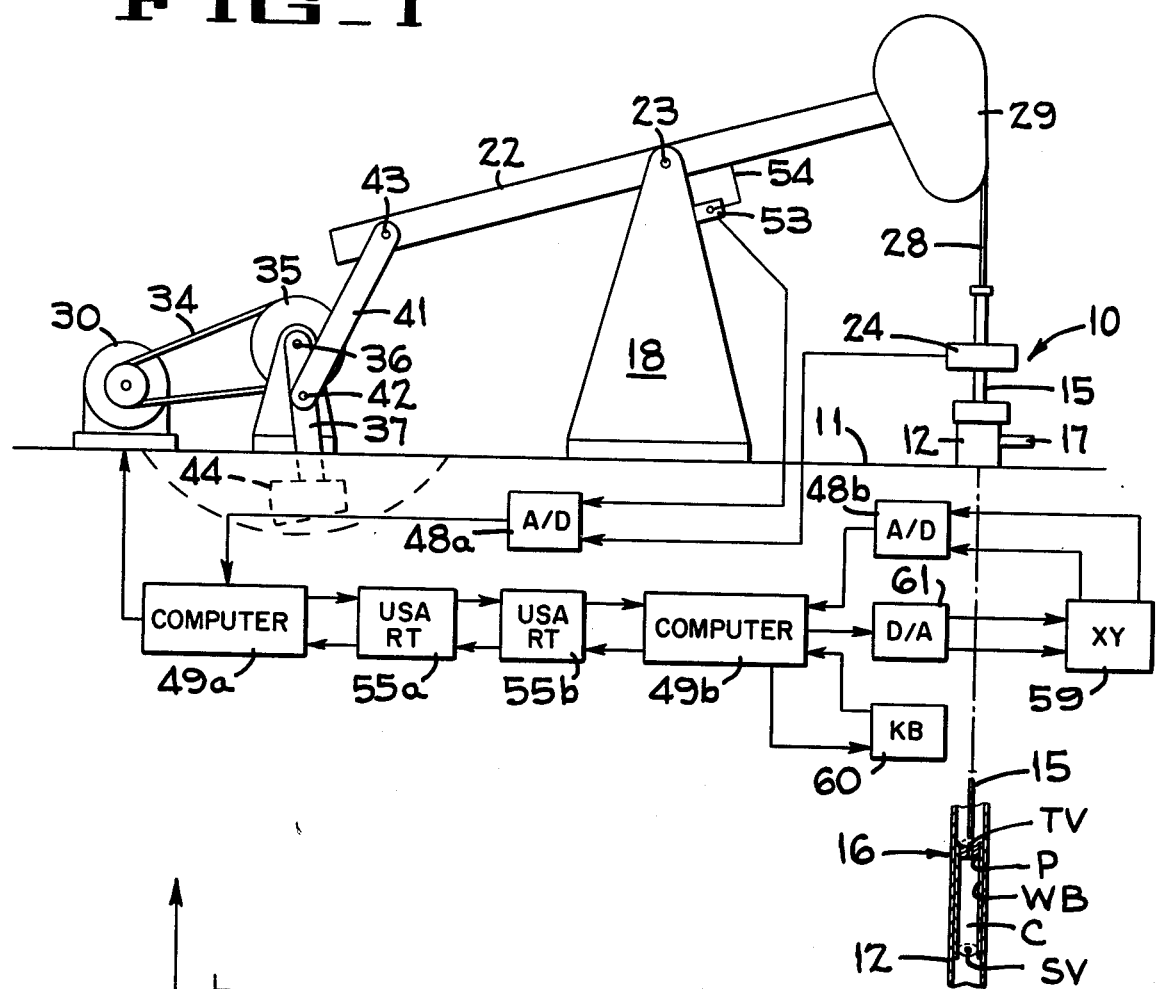
FIG_1
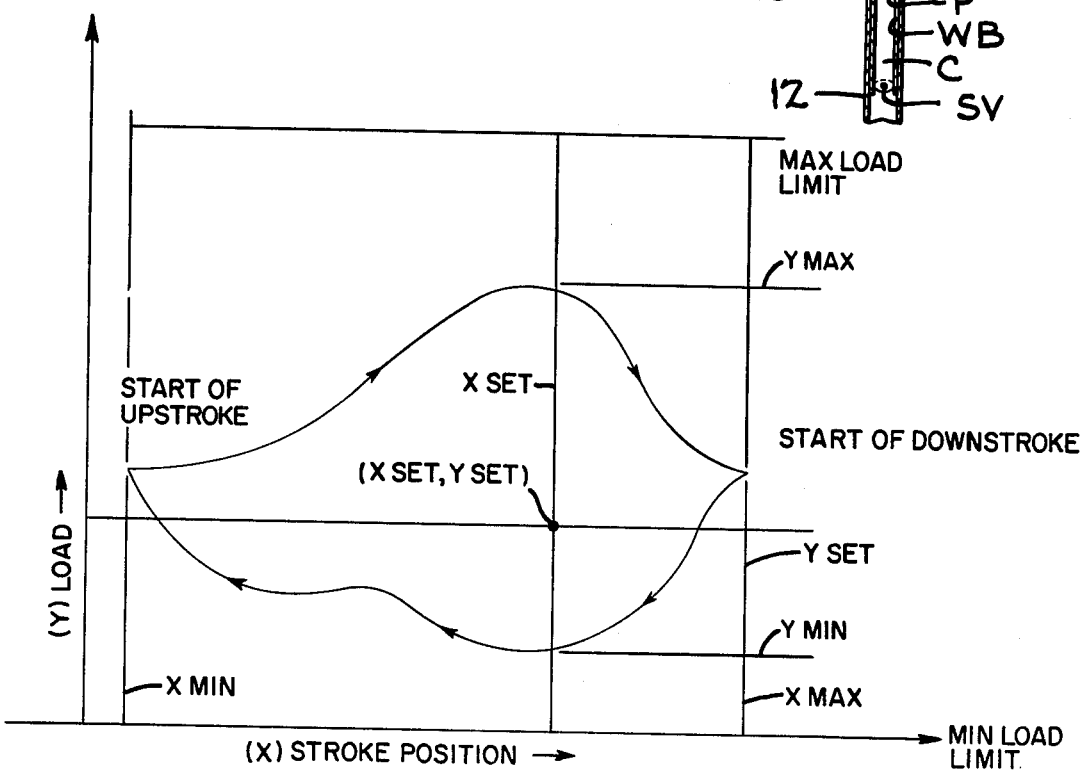
FIG_2

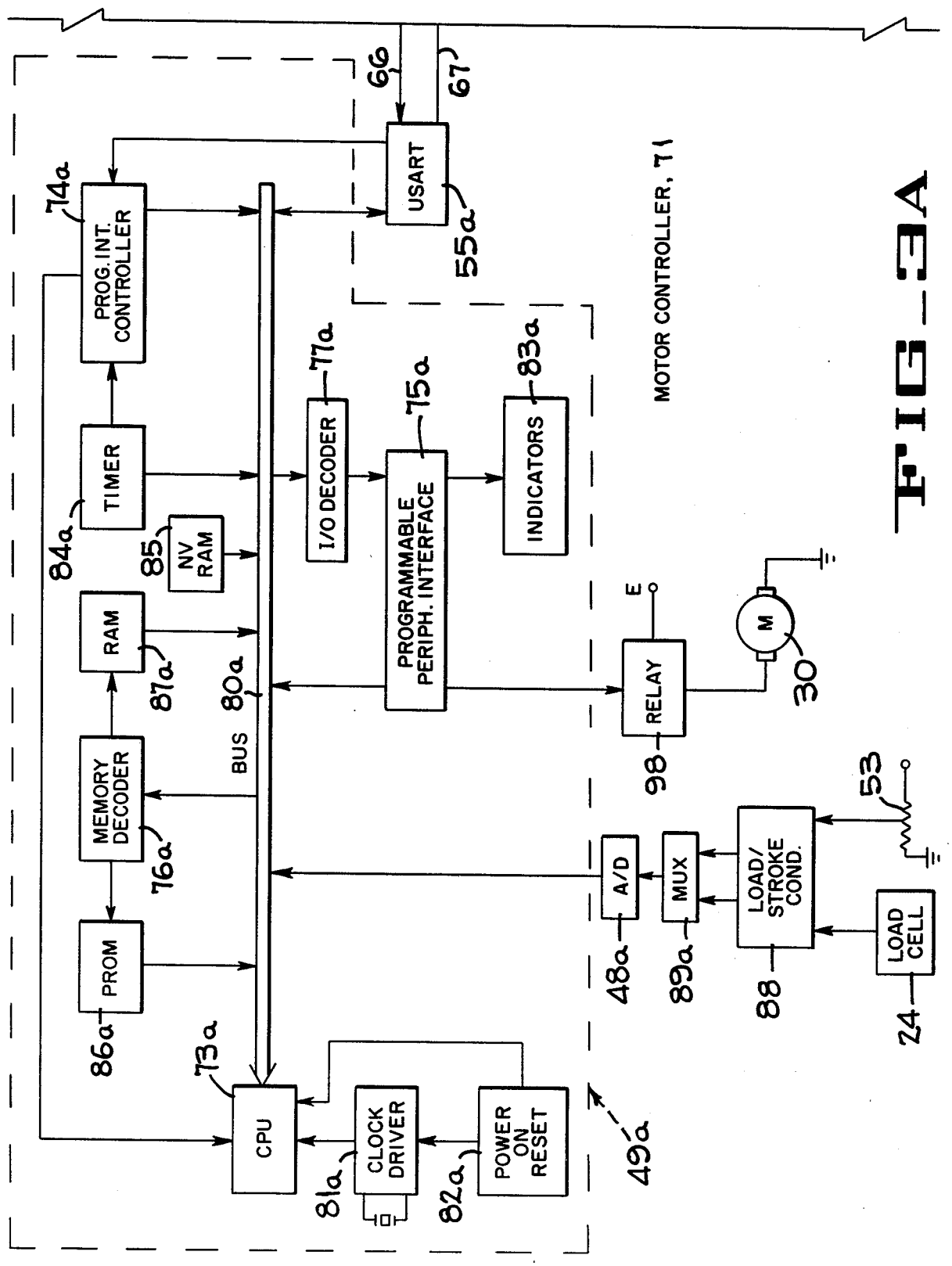

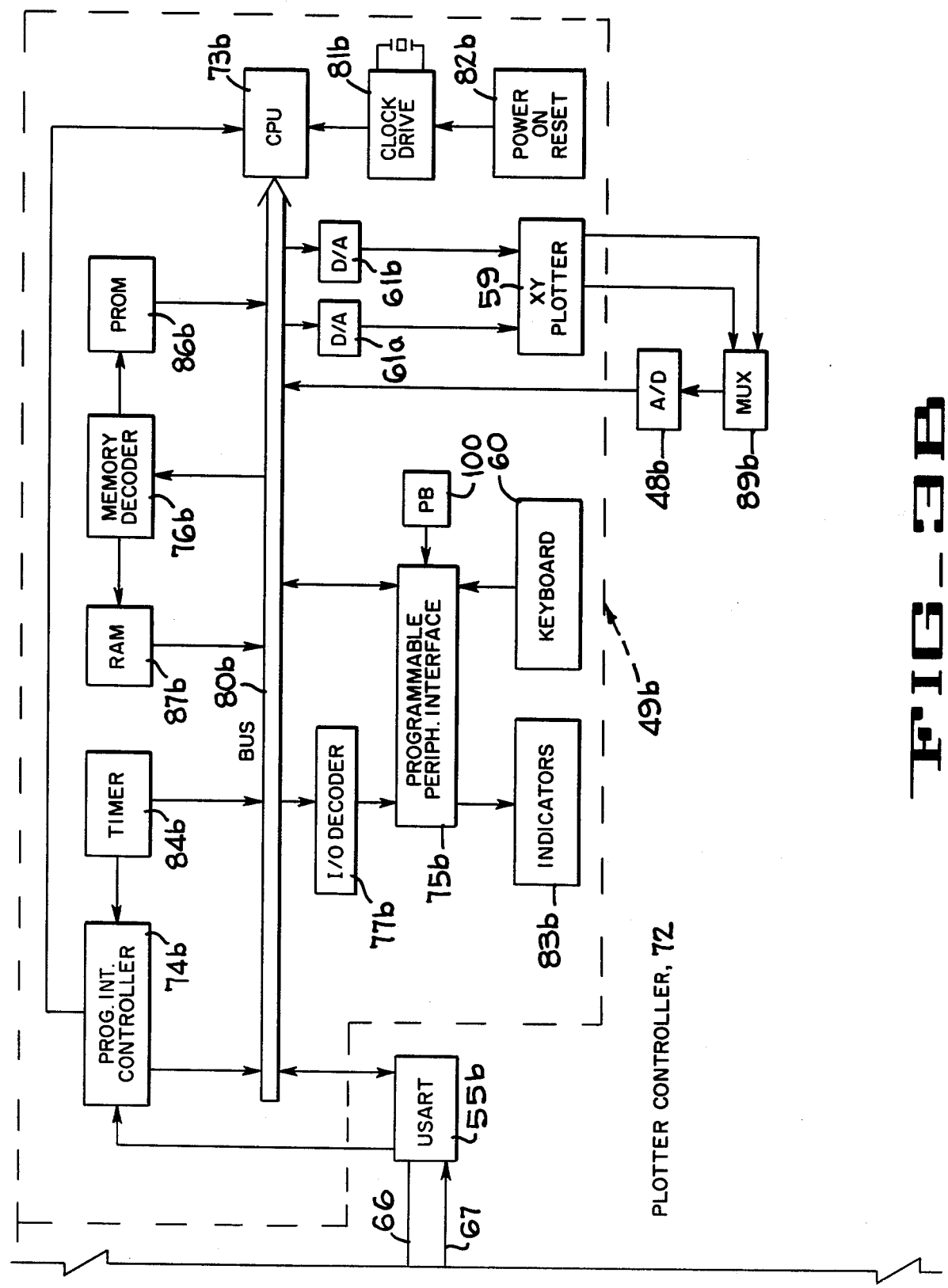
FIG_3B

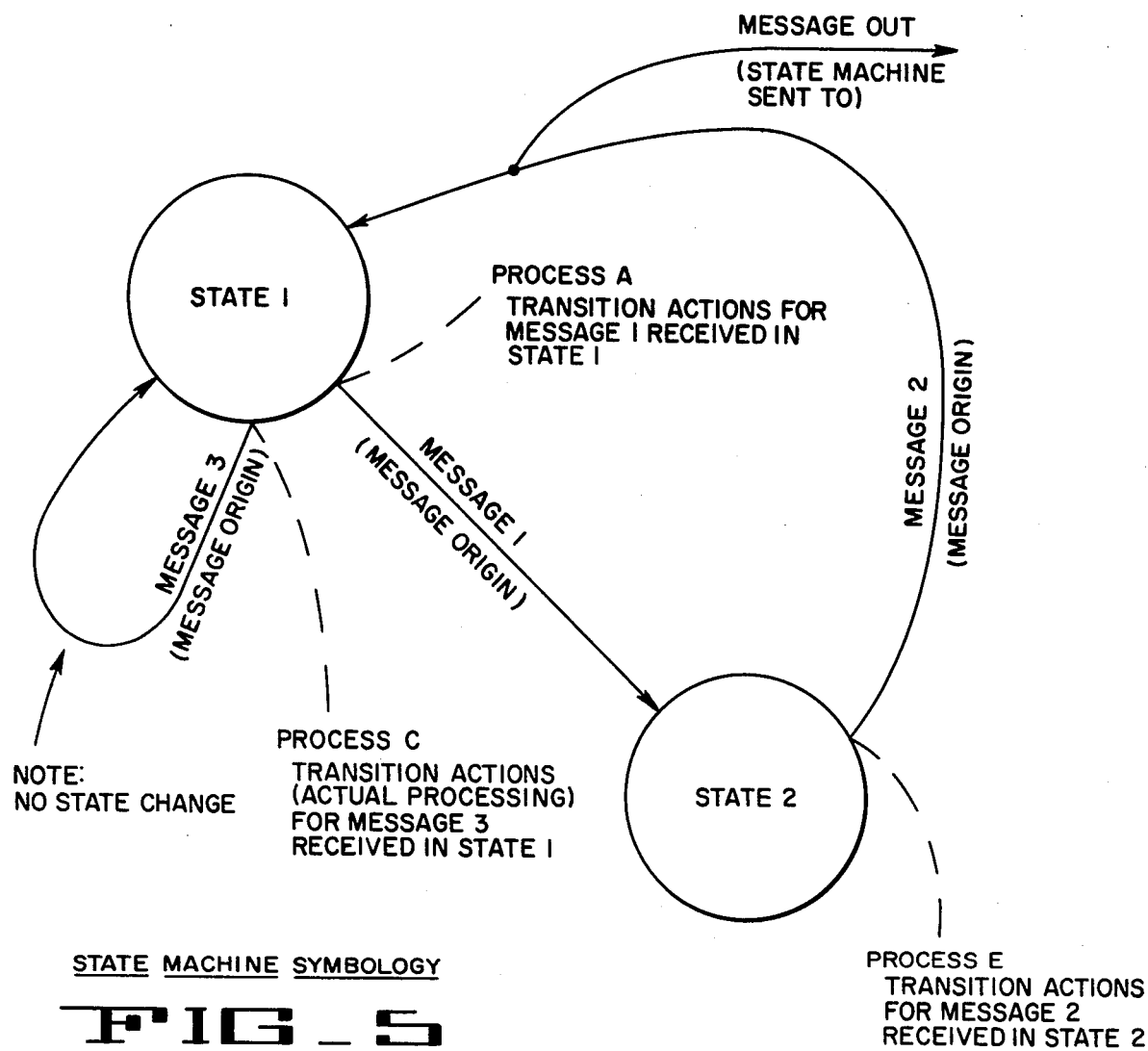

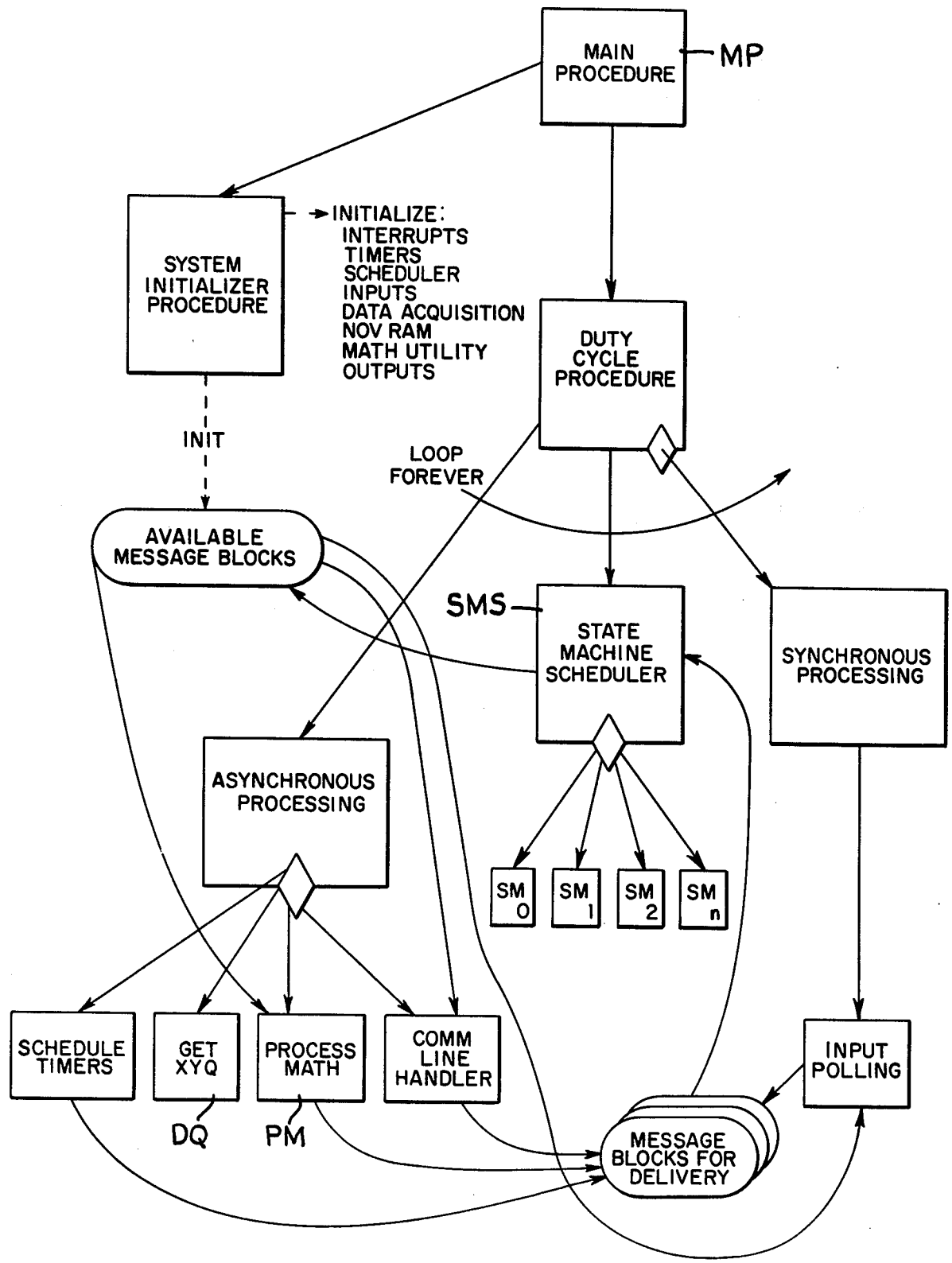

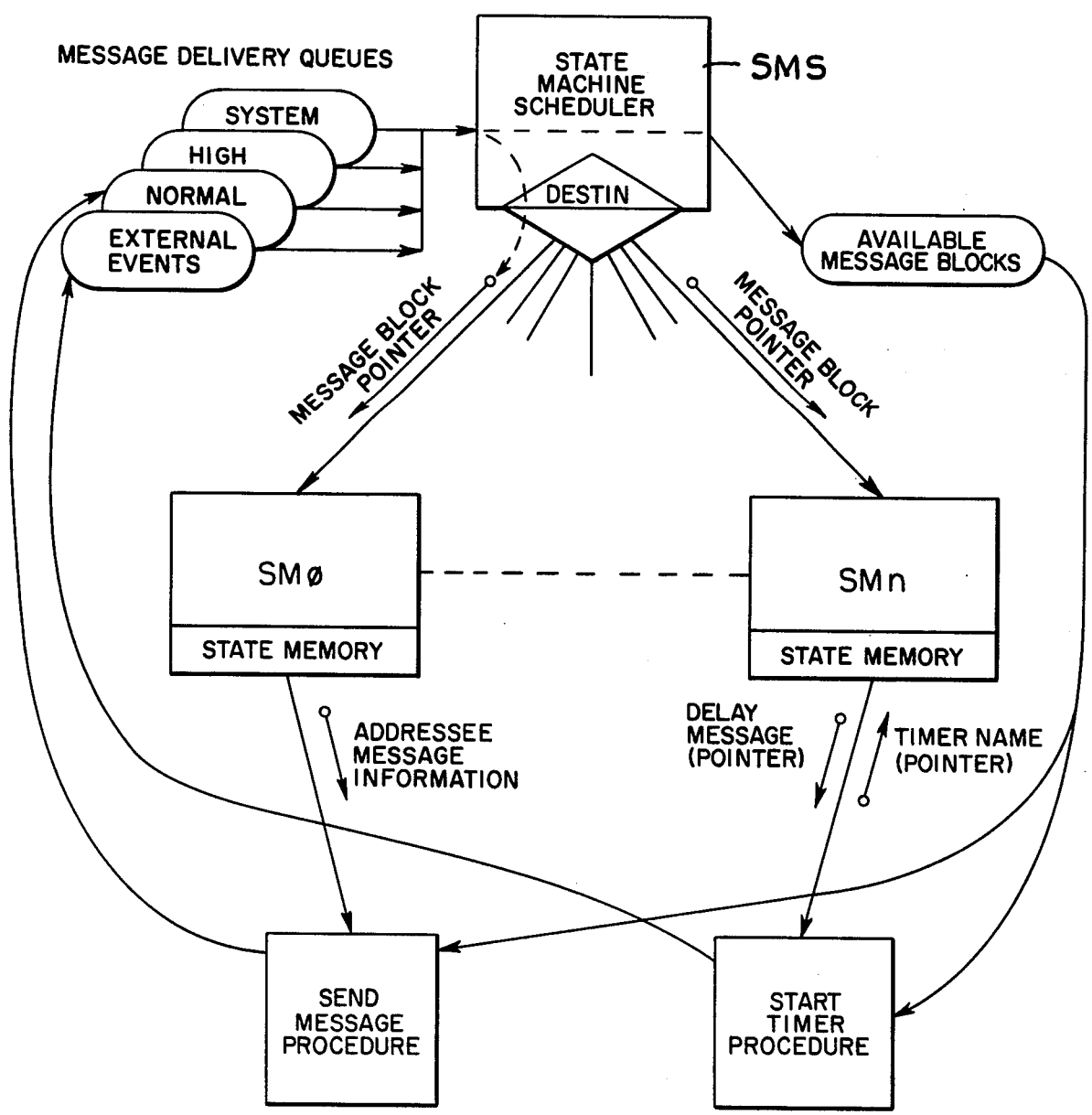
FIG_7
STATE MACHINE SCHEDULER

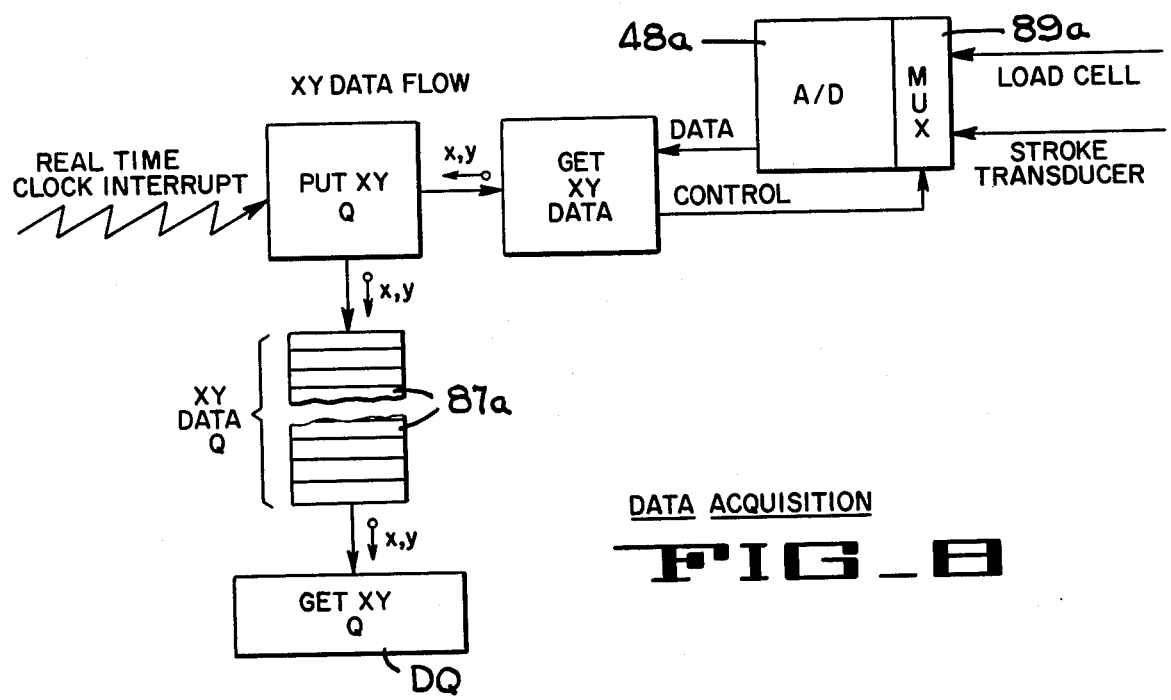
DATA ACQUISITION
FIG_8
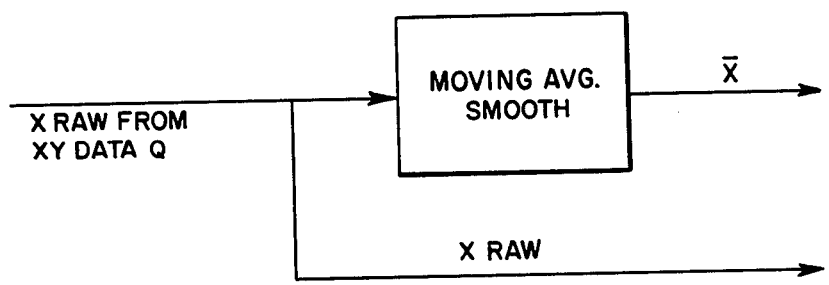
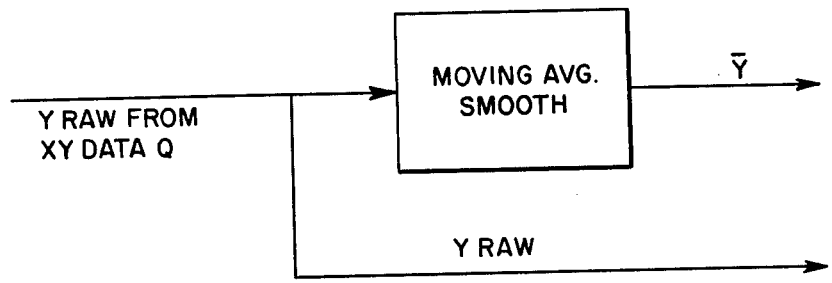
MATH PROCESSING
FIG_9

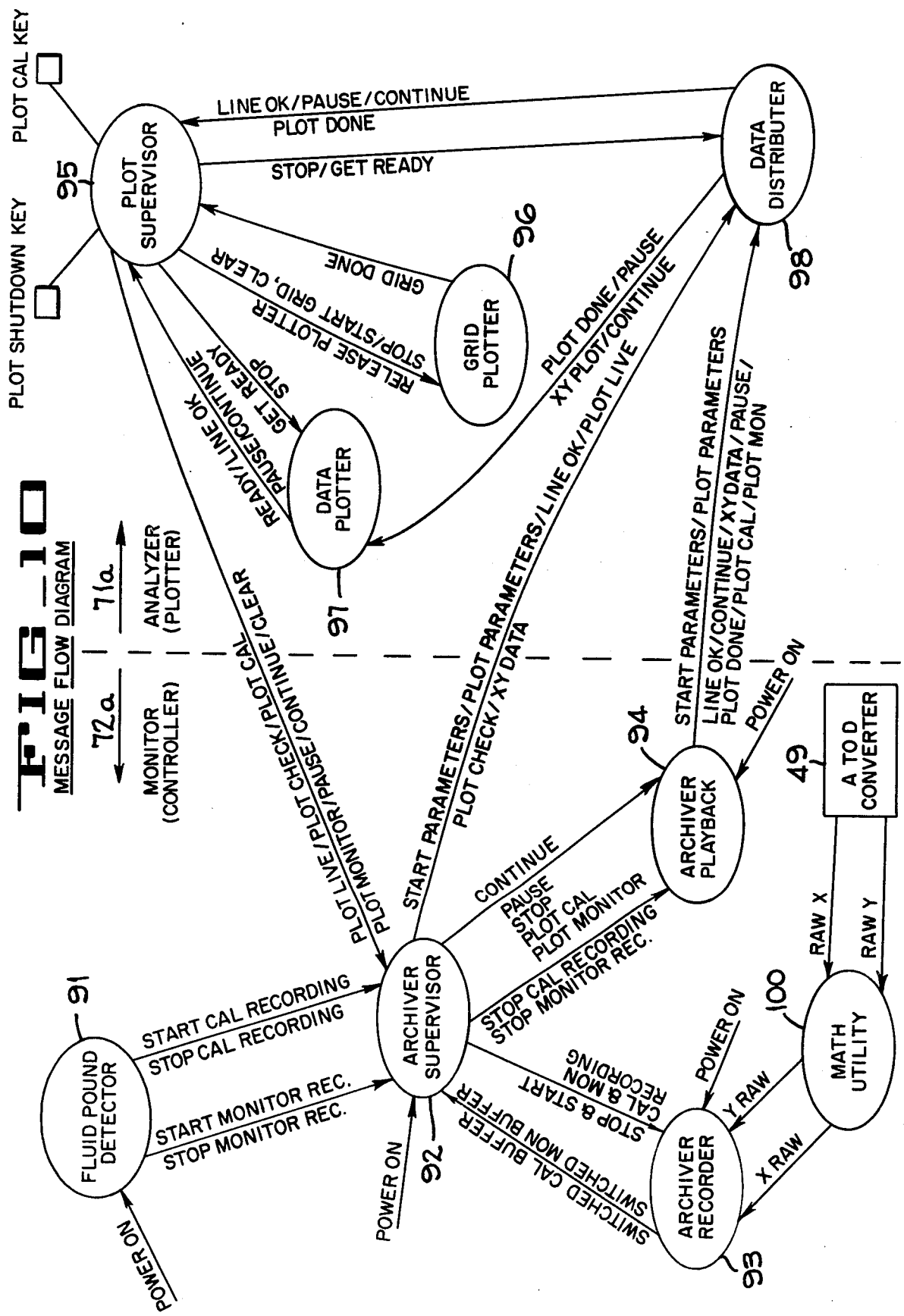
FIG. 10 MESSAGE FLOW DIAGRAM

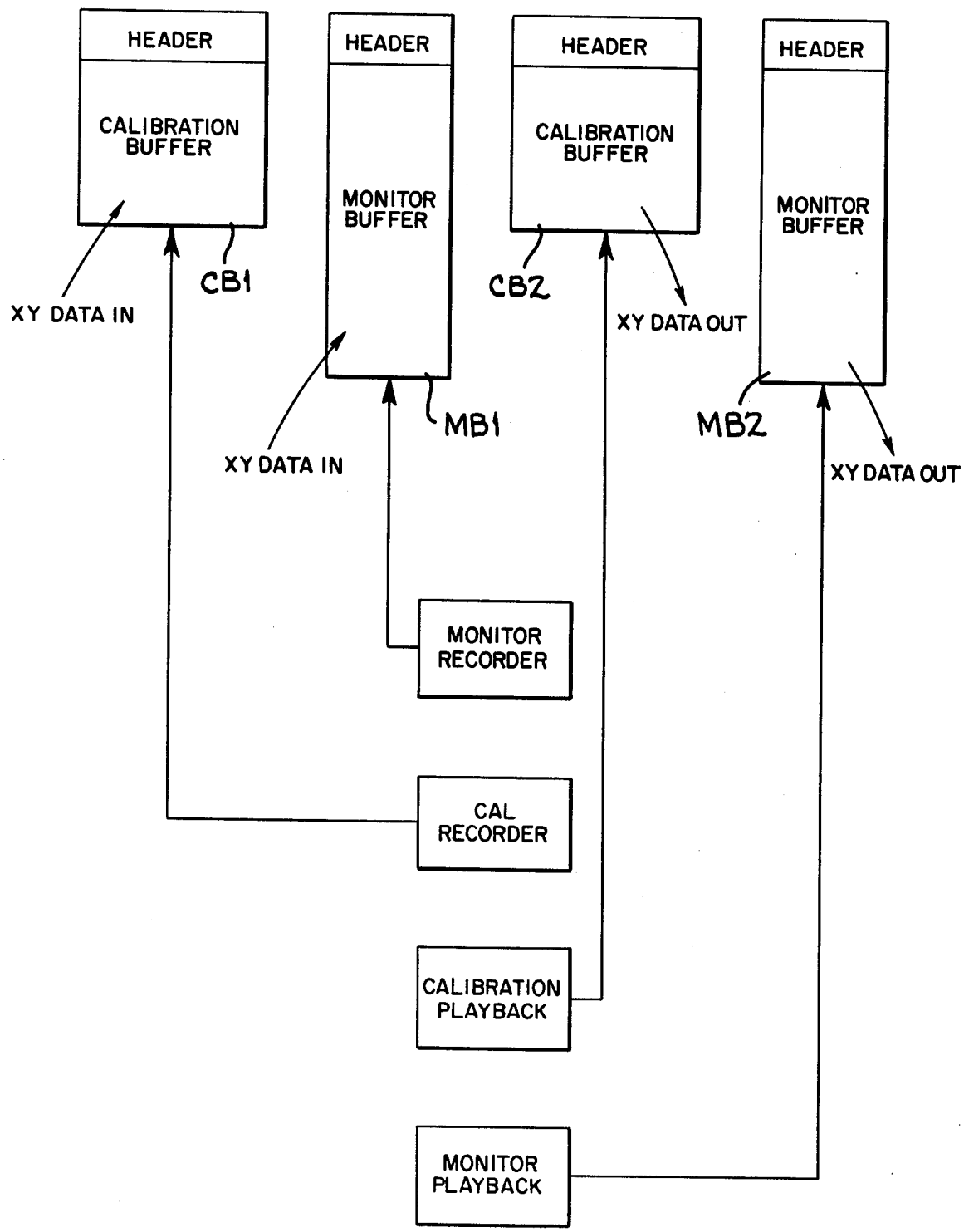
FIG_11
RECORD/PLAYBACK BUFFER FORMAT

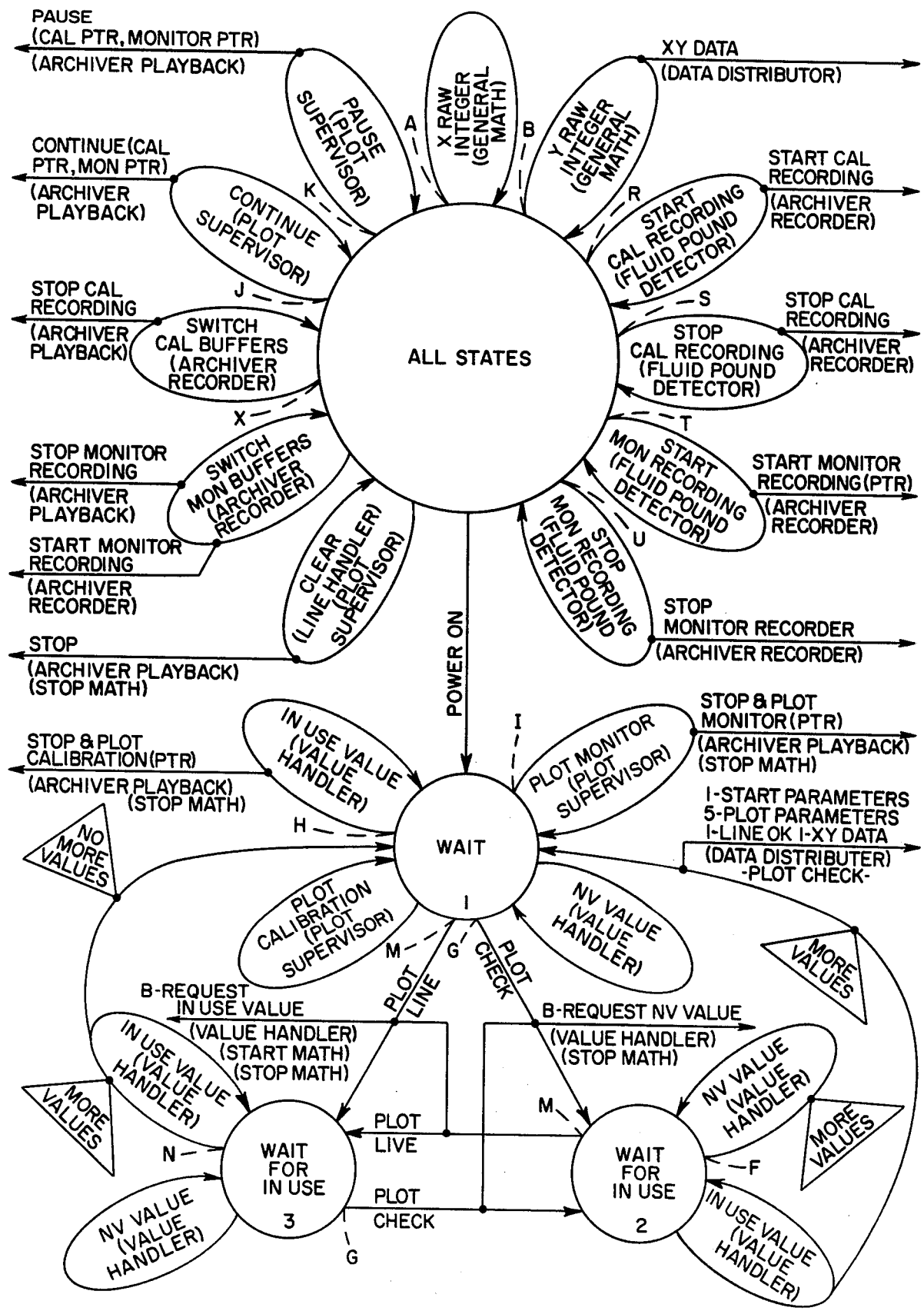
FIG_12
ARCHIVER SUPERVISOR STATE DIAGRAM

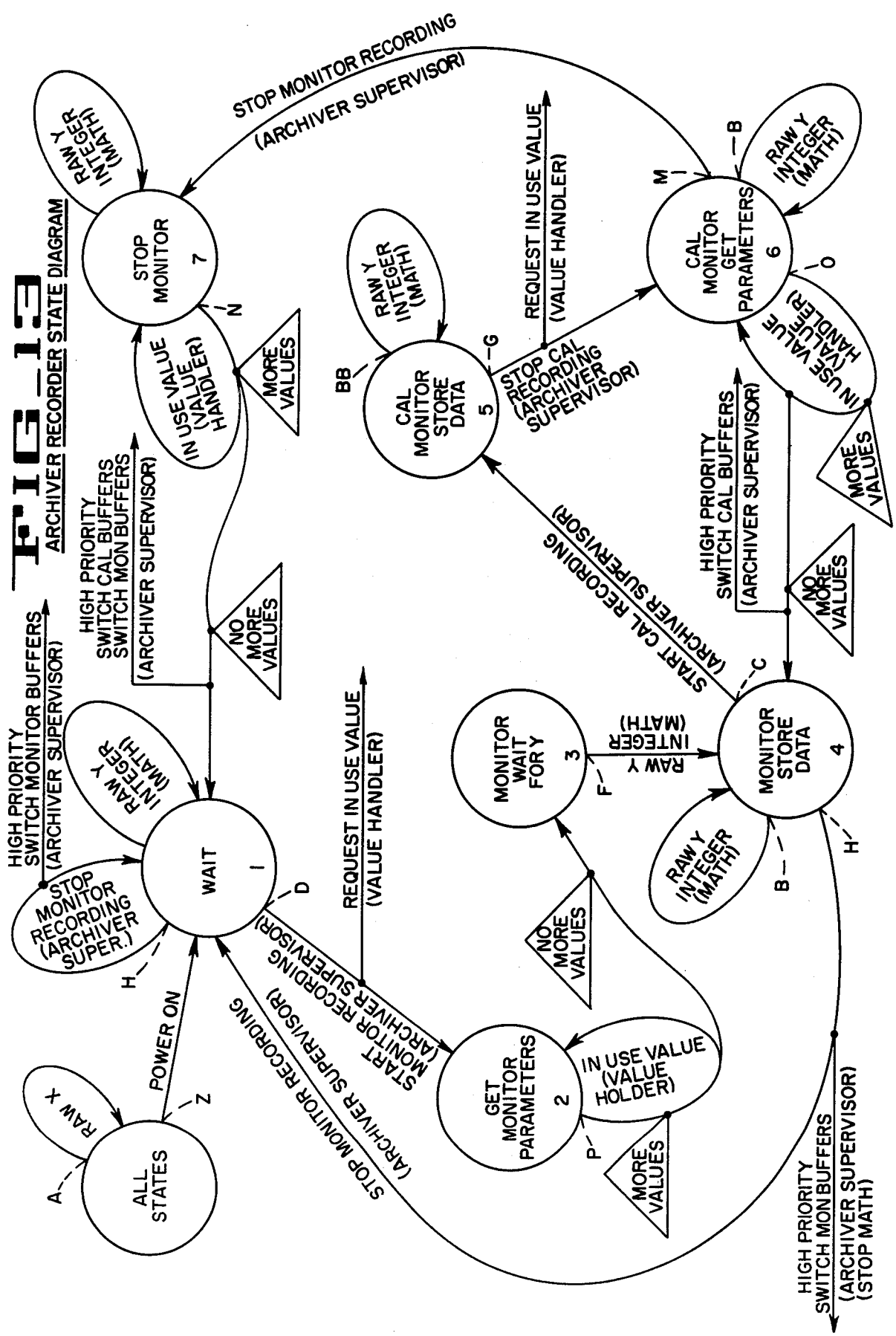
FIG_13 ARCHIVER RECORDER STATE DIAGRAM

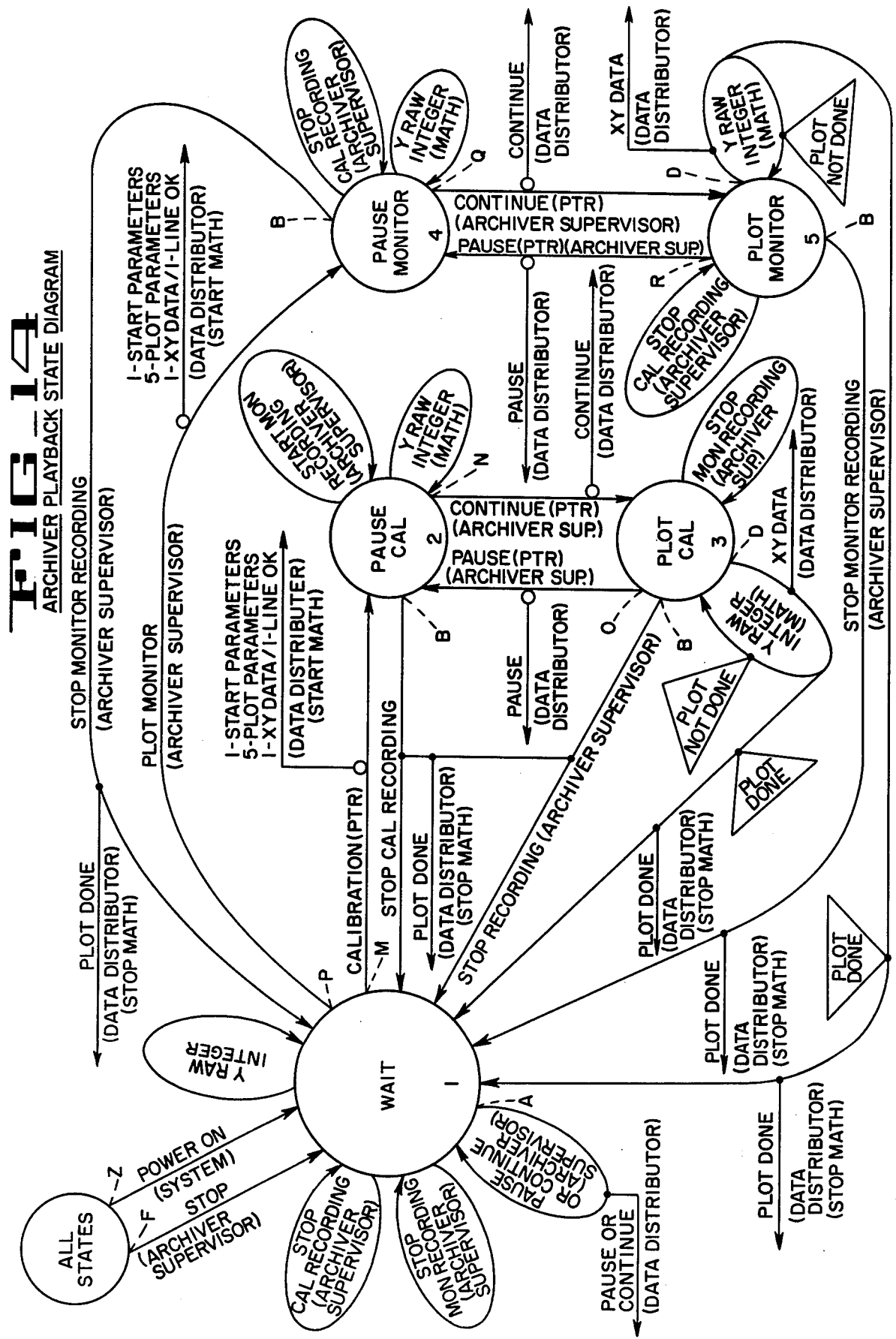
FIG 14 ARCHIVER PLAYBACK STATE DIAGRAM

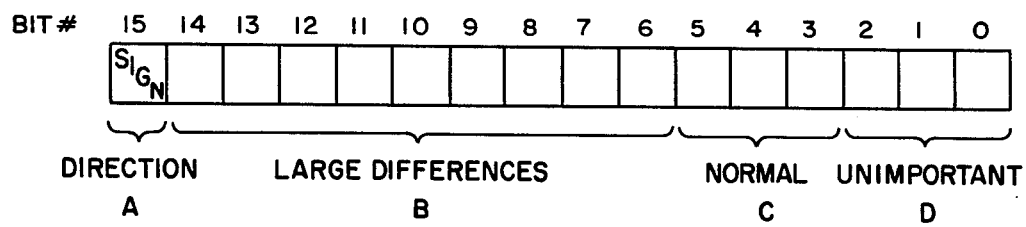
FIG_15
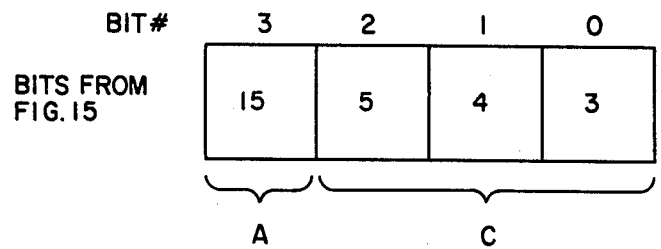
FIG_16

METHOD AND APPARATUS FOR RECORDING AND PLAYBACK OF DYNAGRAPHS FOR SUCKER-ROD WELLS

BACKGROUND OF THE INVENTION

The present invention relates to methods and apparatus for monitoring the operation of sucker-rod well pumping units, and more particularly to methods and apparatus for recording and subsequent playback of selected dynagraphs for wells employing sucker-rod pumping units.

Sucker-rod type pumping units are widely used in the petroleum industry in order to recover fluid from wells extending into subterranean formations. Such units include a sucker-rod string which extends into the well and means at the surface for an up and down movement of the rod string in order to operate the plunger of a downhole pump. Typical of such units are the so called "beamtype" pumping units having the sucker-rod string suspended at the surface of the well from a structure consisting of a Samson post and a walking beam pivotally mounted on the Samson post. The sucker-rod string normally is connected at one end of the walking beam and the other end of the walking beam is connected to a prime mover such as a motor through a suitable crank and pitman connection. In this arrangement the walking beam and the sucker-rod string are driven in a reciprocal mode by the prime mover.

When a problem causes a well to be shut down it is desirable to review the operating conditions immediately prior to well shutdown. This may be done by observing the historical dynagraphs of an instrumented, controlled rod pumped well including:

(1) The dynagraphs utilized by the instrument to calibrate itself.

(2) The dynagraphs just prior to shutdown of the well by the well controller or by other means.

To make this possible, the well controller must save in its memory, a series of load-stroke data points for subsequent playback on an X-Y plotter or other similar device, upon request at sometime in the future. The amount of information which is saved is limited by the amount of memory space available, so it is desirable to compress the data prior to storage in order to conserve memory space.

It is further desirable to display these dynagraphs relative to some absolute frame of reference such as a minimum load limit and a maximum load limit. It is also beneficial to include the thresholds and/or setpoints that the controller detector(s) were using at the time the dynagraphs were recorded.

SUMMARY OF THE INVENTION

The present invention provides new and improved methods and apparatus for recording and subsequent playback of selected dynagraphs for wells having a well pumping unit with a sucker-rod string and a power unit to reciprocate the rod string to produce fluid from the well. A load cell is connected between the sucker-rod string and the power unit to develop a signal representative of the load on the rod string, and a transducer is connected to generate a signal representative of the position of the rod string. When the pumping unit is initially energized the unit is allowed to operate for a brief time to stabilize well operation and the unit is calibrated. During calibration, signals from the load cell and from the position transducer are stored in a memory in a manner which emulates a finite loop of tape and the stored signals are available upon request to create for the purpose of review the dynagraphs which were used to calibrate the system. During operation of the pumping unit, load signals and position signals are stored in another section of memory in the same manner and are available to aid in checking for faults after pump shutdown or for other purposes. Signals are continuously written in the memory during well operation so only the most recently recorded signals are available from memory. When pumping is shutdown, writing in the memory stops so the signals developed in the time period prior to shutdown are saved and are available to aid in determining the cause of shutdown.

The present invention saves the 15 seconds of data preceding the end of the well calibration and the 75 seconds of data preceding the turnoff of the pump. The techniques utilized can be used to save any amount of data and any number of pumping milestones and is not limited to the 15 seconds and 75 seconds of data preceding calibration end and shutdown.

At least one set of memory buffers is utilized for recording and at least one other set is utilized for playback. The recording buffers are of a fixed length, emulating an endless loop of tape. New data is recorded over oldest data until recording is terminated. At the end of the "recording" the roles of the buffers are switched so that the just completed recording is available for playback and new recording then takes place in the old playback buffer. This technique allows historical data to always be available for X-Y plotting, whether or not the pump is running.

BRIEF DESCRIPTION OF THE DRAWINGS

FIG. 1 is a diagrammatic illustration of a well equipped with a sucker-rod type pumping unit.

FIG. 2 is a plot of the position vs. load of the sucker-rod of the pump for one cycle of normal operation and showing a reference point in the plot.

FIGS. 3A, 3B comprise computer circuitry which can be used in the apparatus of FIG. 1.

FIG. 4 is a matrix diagram illustrating the operation of software state machines used in the present invention.

FIG. 5 is a diagram illustrating symbology of a typical software state machine used in the present invention.

FIG. 6 illustrates a message switched software operating system of the present invention.

FIG. 7 illustrates a software state machine scheduler of the present invention.

FIGS. 8 and 9 illustrate the flow of data through the operating system and math utility of the present invention.

FIG. 10 is a message flow diagram showing the method of operation of the apparatus of FIG. 1.

FIG. 11 illustrates the format of a buffer used for storing and retrieving data in a manner similar to using an endless tape.

FIGS. 12–14 are state diagrams which illustrate operation of the apparatus of FIG. 1.

FIG. 15 represents an uncompressed data word of 16-bits used in the present invention.

FIG. 16 represents a compressed data word used to store data points used in the present invention.

DESCRIPTION OF THE PREFERRED EMBODIMENT

Referring to FIG. 1, there is illustrated a wellhead 10 of a well which extends from the earth's surface 11 into a subsurface well producing formation (not shown). The wellhead comprises the upper portions of a casing string 12 with a sucker-rod string 15 extending downward into a down hole pump 16 which moves liquid to the surface where it passes into a flow line 17. The sucker-rod string 15 is suspended in the well from a support unit consisting of a support post 18 and a walking beam 22 which is pivotally mounted on the support post by a pin connection 23. A load cell 24 is connected between the upper end of the sucker-rod string 15 and the lower end of a cable section 28. The cable section 28 is connected to the walking beam 22 by means of a horsehead 29.

The walking beam 22 is reciprocated by a prime mover such as an electric motor 30. The prime mover drives the walking beam through a drive system which includes a drive belt 34, crank 35, crank shaft 36, crank arm 37, and a pitman 41 which is pivotally connected between the crank arm and the walking beam by means of pin connections 42, 43. The outer end of the crank arm 37 is provided with a counterweight 47 which balances a portion of the load on the sucker-rod string in order to provide a more constant load on the prime mover.

The load cell 24 provides a DC output signal which is proportional to the load on the sucker-rod string 15, and an analog-to-digital converter 48a provides a corresponding digital signal to a computer 49a. A position measuring means or transducer 53 includes an actuating arm 54 for measuring the vertical position of the sucker-rod string 15 by providing a voltage which is proportional to the angle of the walking beam 22 and thus is proportional to the position of the rod string 15. The digital-to-analog converter 48a also converts the signal from the transducer 53 into a digital signal which is used by the computer 49a. Signals are transferred from the computer 49a to a computer 49b by a pair of universal synchronous asynchronous receiver transmitters (USARTs) 55a, 55b for controlling the operation of an XY plotter 59. Instructions from a keyboard and display unit 60 and output signals from the load cell 24 are used by the XY plotter to provide a visual plot of the characteristics of the particular well which the rod string operates. The plotter 59 can be used for observing operation of the well and for setting up the equipment to monitor the well. After setup is completed the plotter can be disconnected, or if desired the plotter can be eliminated altogether and other means for setting up the equipment can be used. Analog signals from the XY plotter 59 are converted into digital signals by an analog-to-digital converter 48b for use by the computer 49b and digital signals from the computer 49b are converted into analog signals by a digital-to-analog converter 61 for use by the plotter.

A plot of the position versus load of the rod string 15 for a typical cycle of the rod string when the well is filled with fluid is disclosed in FIG. 2. It can be seen that as the rod string moves on the upstroke from the Xmin position to the Xmax position, the load on the string increases to a maximum value and then returns to approximately the initial value.

Details of a method and apparatus for recording and subsequent playback of selected dynagraphs for sucker-rod pumped wells are disclosed in FIGS. 3A and 3B. When FIGS. 3A, 3B are placed side-by-side with leads from the right side of sheet 3A extending to corresponding leads from the left side of sheet 3B the two sheets comprise a block diagram of an embodiment of the computers 49a, 49b (FIG. 1).

The portion of the computer system disclosed in FIG. 3A comprises a motor controller 71 for receiving signals from the load cell 24 and from transducer 53 and for using these signals to determine the sequence for controlling the motor 30. The computer 49b disclosed in FIG. 3B comprises a plotter controller 72 for using the load cell and transducer signals transmitted from computer 49a to operate the XY plotter 59. Signals are interchanged between the motor controller 71 and the plotter controller 72 over the pair of interconnecting wires 66, 67.

Each of the controllers 71, 72 includes a central processor 73a, 73b, a programmable interrupt controller 74a, 74b, a programmable peripheral interface 75a, 75b and a memory decoder 76a, 76b connected for the interchange of information and instructions over a system bus 80a, 80b. A central processor 73a, 73b which can be used in the present invention is the model 8088 manufactured by Intel Corporation, Santa Clara, Calif. A programmable peripheral interface 75a, 75b which can be used is the model 8255A and a programmable interrupt controller 74a, 74b which can be used is the model 8259A both manufactured by Intel Corporation. An input/output decoder 77a, 77b decodes address signals for selectively enabling the peripheral interfaces 75a, 75b to send and receive information from the system bus 80a, 80b.

Clock pulses for driving the central processors 73a, 73b are provided by a pair of clock drivers 81a, 81b which are initialized by a pair of "power on reset" generators 82a, 82b. The generator 82a also includes a power fail circuit to warn that power to the controller is failing. A clock driver 81a, 81b which can be used in the present invention is the model 8284A manufactured by Intel Corporation. A pair of indicating devices 83a, 83b provide visual display of information from the peripheral interfaces 75a, 75b. The indicating device 83a also includes a plurality of switches for entering information into the motor controller. A pair of timers 84a, 84b provide timing signals to operate the controllers 74a, 74b and information is transferred between the motor controller 71 and the plotter controller 72 by the pair of universal synchronous asynchronous receiver transmitters (USARTs) 55a, 55b. One such USART which can be used in the present invention is the model 8251A manufactured by Intel Corporation. Programs for operating the motor controller 71 and the plotter controller 72 are stored in a PROM 86a, 86b and data for use in the system is stored in a RAM 87a, 87b. Data to be retained during a power failure can be stored in a nonvolatile RAM 85. A load/stroke conditioner 88 (FIG. 3A) amplifies and filters signals transmitted from the load cell 24 and the transducer 53 and sends the smoothed signals to the bus 80a through a multiplexer 89a and the analog-to-digital converter 48a. A pair of digital-to-analog converters 61a, 61b (FIG. 3B) provide analog signals to operate the XY plotter 59 in response to digital signals on the system bus 80b. A multiplexer 89b and the analog-to-digital converter 48b provide digital signals which correspond to the X and Y positions of the plotter 59. An analog-to-digital converter which can be used is the model AD574A manufactured by Analog Devices.

The general operation of a dynagraph recording and playback apparatus of the present invention has been described in connection with FIGS. 1-3. A detailed description of the method of using the motor controller 71 and the plotter controller 72 to record and playback load-stroke dynagraphs will be described in connection with FIGS. 4-9 which provide background of the use of software state machines and of their use in operating the apparatus of FIGS. 1, 3A and 3B and provides details of the operation of a computer program in carrying out various operations performed by the computer of FIGS. 3A, 3B.

The program of the present computer is supported by a real time operating system having various routines that are not applications oriented and that are designed specifically to support programs designed with the state machine concept, that is, a state, input driven program. Some of the routines are sub-routines while others form a module that creates a simple real-time environment under which software state machines can operate. The operating system provides equipment in which a collection of software state machines can operate.

A software state machine is a process that is executed on the digital computer each time that a message is sent to the state machine. The process does not execute in exactly the same way each time that a like message is sent to it because the processing to be done for any message depends on the machine's "state", i.e., its memory of all prior processing that it has done in response to the previous messages. The state can be any length, from eight binary digits to several thousand binary digits depending upon the complexity of a given machine. Given the state of the machine and the current message, the machine will do a given set of processing which is totally predictable. A machine can be represented as a matrix of processes, indexed by a state and a message as shown in FIG. 4. For example, if the state machine of FIG. 4 receives message number one in state one, then process A will be done. If process A were to cause the state to be changed to state 2 then a second message number one, coming right after the first message would cause process D to occur which could cause the machine to change to state 3. It is not necessary that a process cause the state to change, although it may do so in many cases.

A software state machine, upon completing its process defined by the state and by the message returns control to the program that called it, the state machine scheduler which will be described below. During the given process, the machine is not interrupted in order to give processing time to another machine of the same system. Thus, processing time apportionment between a given machine and any of its contemporaries in the system is on a message-by-message basis, and such an environment is called a message switched operating system (MSOS). None of the machine's processes are ever suspended for the processes of another machine. For example, if message three comes in state one, process C will begin and end before another state machine can have the central processing unit (CPU) 73a (FIG. 3A) to respond to its next message in its given state.

Certain things can cause a state machine process to "suspend". For example, an asynchronous interrupt can be registered and processed. A requirement of the operating environment is that such hardware events are turned into software messages to be processed in order by the responsible state machine. Only that processing that must be done at the exact instant of the interrupt is done and then the interrupt service process will cause a software flag to be raised, ending the interrupt process. When the operating system notes an asynchronous flag (semaphore), it generates the needed software message to be sent to the state machine that will carry out the non-time-critical segment of the interrupt processing. An example of such a process is data collection at precisely timed intervals. When the timer interrupt signals that data must be collected, it is read in the required manner dependent on the type of the data, queued in a storage area for processing at a later time, and a flag is raised. When this raised flag is noted by the operating system, a software message is generated, the data is stored and the state machine that is responsible for the processing of this data receives the message at a later time.

A state machine is not given access to the processor by the operating system on a regularly timed basis but is connected to the processor only in order for it to process a message. Whenever the processing of a message is completed the state machine must ensure that it will get another message at some point in the future. This is done in the following ways:

(1) Another machine sends a message for synchronizing purposes.

(2) A time period elapses signaled by a timer message.

(3) Real-time data becomes available from some queue.

(4) An input which is being polled, achieves the desired state, and initiates the software message.

(5) An interrupt is sensed and a software message is sent to inform the state machine about this event.

The only time that a machine cannot take care of itself is prior to receiving its first message, so the operating system takes the responsibility of initiating the system by sending to all of the software state machines, functioning therein, an initializing message referred to herein as a "power on" message. No matter what the state of the machine it will respond with a predetermined given process when this message is received independent of the state of the machine.

A convenient means of illustrating the operation of a software state machine is shown in the state machine symbology of FIG. 5 using the messages of FIG. 4 to do some of the processes and to move into some of the states shown in FIG. 4. If we assume the machine (FIG. 5) to be initially in state one, the receipt of message one causes process A to be performed as the transition action for message one received in state one and also causes the machine to move into state two. In state two the receipt of message two causes process E, causes a message to be sent out to another state machine and moves this state machine back into state one. In state one the receipt of message three causes process C as the transition action for receiving message three in state one but does not cause any change in the state of the machine. Some of the other states and processes shown in FIG. 4 are not repeated in FIG. 5 in order to simplify the drawing.

A message switched operating system of the type shown in FIG. 6 includes a main procedure which provides signals to initialize the system through a system initializing procedure and includes the initialization of various interrupts, timers, the scheduler, inputs, data acquisition, the nonvolatile RAMs, the math utility and outputs as well as initializing the available message blocks so that all dynamic memory is put into an available space queue for storing data. The procedure then calls the duty cycle procedure which sequentially calls the asynchronous processing, state machine scheduler and synchronous processing over and over again. All interrupt programs communicate with the duty cycle program by way of semaphores. The duty cycle program runs indefinitely with a state machine message delivery, an asynchronous operation and all synchronous operations timed by the real-time clock for each cycle of the loop. Asynchronous operations that can occur are: data input from a real-time data acquisition queue and communication line interrupts to move characters in and out of the system. In the asynchronous operation significant events occurring cause an available message block to be secured and turned into a message to be delivered to whatever state machine is charged with processing the particular interrupt. Since the data is queued at the time of acquisition, the transfer operation is asynchronous. If the data processing falls behind the data input, the system can use the time between synchronous clock ticks to catch up on the required operation. Details of the data flow in the asynchronous processing of the DQ block of FIG. 6 are shown in FIG. 8. Signals from the load cell 24 and the stroke transducer 53 (FIGS. 1, 3A) are acquired by the GET XY data procedure and are transferred into the XY data Q in RAM 87a (FIG. 3A) by the PUT XY Q procedure in response to a real-time clock interrupt and are removed by the GET XY Q procedure.

Once the data has been acquired it is processed by the math utility (at PM, FIG. 6). The math utility accesses the raw values of stroke (X) and load (Y) and smoothes the values of X and Y. The smoothed value of X ($\overline{X}$) (FIG. 9) and the smoothed value of Y ($\overline{Y}$) are obtained by using a moving average smoothing technique where the last n values of X (or Y) received are added and divided by the number of values (n) to obtain a first smoothed value. To obtain the next smoothed value, $\overline{X}$, the newest value is included in the sum, but the oldest received value is not included. The values of $\overline{X}$ and $\overline{Y}$ are then sent to all state machines that have signed up for these values using the "send message" procedure (FIG. 7) to place the messages on the queue of messages to be delivered.

The synchronous processing performs hardware input polling, timer aging and signal delivery. When an input, requested for polling by any state machine, gets to the desired state such as an off condition, an on condition, above a level or below a level, etc. an available message block is sent as a message to the requesting machine indicating that a given input is in the desired state. The input will no longer be polled until another request is made.

The timer process is slightly different in that the timer queue is made up of message blocks serving as receptacles for the machine requesting the marking of the passage of time and the time of day when the time will be completed. When the time is completed the block is removed from the timer queue and placed on the message delivery queue as a message. Thus, all responsibilities placed on the state machine are accomplished in the operating system by transferring software messages and by the use of real-time flags and queues (semaphores).

The first component of the operating system (FIG. 6) is a program to deliver a message to a state machine (FIGS. 6, 7). A message is a small block of dynamic memory that is queued for delivery to a designated state machine. This program is called a state machine scheduler and shown in detail in FIG. 7 selects the next highest priority message from the queues of messages ready for delivery. The machine looks up the designation state machine code stored in the message and uses that code to select the proper state machine program to be called with a pointer to the message block as an input. Contained in the program is a state memory. With the memory and the state the proper process can be delivered and executed, and the memory block transferred from the delivery queue to the available space queue for subsequent reuse. Two examples of data that is reused are instructions for sending the messages or setting timers. These processes take available blocks and turn them into messages that will be on the message delivery queue at some later time. Programs such as the message sender and the timer starter are service utilities called by the state machine in order to fulfill the responsibilities alluded to earlier. The state machine scheduler program is the lowest form of the hierarchy which forms the main duty cycle of the operating system. In the diagram of FIG. 6 the relationship of the scheduler to the rest of the operating system is shown.

When power is turned on in the computers of FIGS. 3A, 3B, the power on reset generators 82a, 82b provides signals which reset various hardware in the computer and cause the first instruction of the computer program stored in the PROM 86a to be executed by the central processor 73a. A "power on" message is sent, in the manner previously described, to each of the state machine modules 91-98 (FIG. 10) in the computers and these state machine modules are initialized. The load signal values from the load cell 24 (FIG. 3A) and the stroke signal values from the transducer 53 are obtained by the processor 73a through conditioner 88 and converter 48a and stored in the RAM 87a (FIGS. 3A, 8) for use by the math utility which smoothes these signals as previously described. These smoothed values of load and rod position are available to other state machine modules upon request.

The message flow diagram of FIG. 10 discloses the flow of messages between a plurality of state machine modules 91-94 in a monitor 72a and a plurality of state machine modules 95-98 in an analyzer 71a. The message flow between the various modules within the analyzer 71a, between the modules within the monitor 72a and modules in the analyzer 71a and in the monitor 72a is shown.

A "power on" message to the modules 91-94 cause these machine modules to be initialized and to move into their wait states (FIGS. 12-14). The archiver supervisor 92 (FIG. 10) clears data from all of the buffers CB1, CB2, MB1, MB2 (FIG. 11) and selects the buffers to be used for calibration recording, for calibration playback, for shutdown recording and for shutdown playback, with one of the four buffers used for each of these features. When the fluid pound detector 91 (FIG. 10) receives the power on message, it sends a "start monitor recording" message to the archiver supervisor 92 to cause the start of the shutdown history or "monitor" recording process. This same message could have been initiated by any of the software state machines or it could be initiated externally, but the choice of the fluid pound detector 91 proves to be convenient since the state machine has knowledge of the start and end of both the calibration and the monitor periods. It should also be noted that the recording (calibration) period is also included in the monitor period. If desired, these recording periods could be sequenced in any order. The archiver supervisor 92 (at T, FIG. 12) passes the start monitor recording message to the archiver recorder machine along with a pointer to the memory buffer to be used for shutdown (monitor) recording. When the recorder receives this message (at D, FIG. 13) it first requests certain key values that are to be used at this time from other state machines in the system. These values include, but are not limited to the following:

(1) Actual rod load maximum
(2) Actual rod stroke maximum
(3) Actual rod load minimum
(4) Actual rod stroke minimum
(5) Stroke set point
(6) Load set point
(7) Rod load limit maximum, and
(8) Rod load limit minimum.

Once these requests are made the recorder (FIG. 13) moves to the get monitor parameters state (2) to await receipt of the parameters. As each requested parameter is received (at P, FIG. 13), it is identified and then placed in a location of the monitor buffer header (FIG. 11) reserved for it. If a conversion is required from analog-to-digital counts to engineering units it is done at this time. When all the requested parameters have been received and saved in the monitor header memory MB1 or MB2 (FIG. 11) the X (stroke) and Y (load) raw values (stroke and load) flow is requested from the math utility 100 (FIG. 10) and the state is set to the monitor wait for Y state (FIG. 13 at 3).

With the archiver recorder in the monitor wait for Y state the first value of X received is saved in a temporary memory. When the first value of Y is received (at F, FIG. 13), both the first X and the first Y values are placed uncompressed into the buffer header to be used sequentially by the data compression and expansion techniques. The archiver recorder is set to the monitor store data state (at 4, FIG. 13). In this state raw X and Y values are received (X is received first, then Y) at the sampling rate from the math utility 100 (FIG. 10). When an X value is received it is saved in a temporary memory. When a Y value is received (at B, FIG. 13) the X and Y values are stored in the monitor buffer MB1, MB2 (FIG. 11) in compressed form. A 4:1 compression is achieved by storing two 16-bit values in one 8-bit location using base-offset low fidelity data compression. The data is stored in the buffer as one base value and a series of deltas or differences from the last data point, for example:

| Buffer base (data 0) and d1, d2, dn |
|---|
| Where d1 = data 1 − buffer base<br>d2 = data 2 − data 1<br>dn = data n − data n − 1 |

This method does not compress the total number of bits in the buffer but since data n is always close to data n+1, then in the case of 16-bit data, 8-bit differences can be stored (as one sign bit plus 7 magnitude bits) and a 2 to 1 compression is effected. Any time the difference is greater than 7-bits, fidelity is lost.

This reasoning can be extended one step further by reducing fidelity purposefully. By looking at the 16-bit difference between adjacent data points, the 15-bit magnitude can be divided into 4 distinct regions, A, B, C and D as indicated in FIG. 15.

A 4:1 compressed, lower fidelity representation of the difference of FIG. 15 is shown in FIG. 16, where the sign bit (15 or region A) of FIG. 15 has been placed in bit 3 of FIG. 16 and bits 3, 4 and 5 (region C) of FIG. 15 have been placed in bits 0, 1 and 2 of the 4-bit word of FIG. 16. This is possible because region D (FIG. 15) is ignored as a fidelity reduction, and B (FIG. 15) is ignored because the data is assumed to be close together. If any bit is a logic 1 in region B (having a larger than anticipated difference), then region C is forced to the maximum difference of:

1 1 1 no matter what the original difference was. When the data is to be reconstituted (expanded) a 16-bit difference is reformed by putting A and C back into position, and setting regions B and D to zero. Since, by this method, the real data values are lost, when a new base for a buffer is needed it comes from reconstituting the current base and the oldest difference to get a new base. When a new value is to replace an old value, it is convenient to have the next youngest data value as a base, but it is lost and will never be available for use in reconstitution. However, the value for that point which will correspond to it during reconstitution will be available and could be remembered during compression. Then new data can be stored as an offset from that base. Since fidelity is sacrificed, the prior base plus the newest reconstituted difference is used as the new base point for the next data point to be stored at some point in the future. These base points will track (be close in value to) recent data, but rarely will they be equal. It is guaranteed that when the whole buffer is reconstituted, the last point regenerated will be exactly equal to this buffer end base point.

Because the data points never have any logic 1-bits in bits 2, 1 and 0 in the reconstituted form, a moving average "filter" is used to take the digital steps out of this data. This filter, of course, will generate values with bits on (having logic one-bits) in the 2, 1 and 0 locations. For example, if the reconstituted data were the following values from a ramp that was compressed and reconstituted:

8, 16, 32, 24, 48, 48, 56 a five point moving average would give:

8, 16, 25, 33, 41, 48, 56 where the middle 3 values indeed have low order bits after smoothing and would better resemble the ramp.

If a high data rate were used for sampling the original signal, then one bit could be used just to store the sign with an implied magnitude of 1 count. If this were done, then the method would be that commonly called "delta modulation" and used in telephonic applications to compress speech data from 24 kilobits/second to 3 kilobits/second with some loss of fidelity. However, a data rate of 3 kilobits/second is needed to keep the point to point differences small. For a sucker-rod pump oil well dynacard to be sampled often enough to use this technique would be impractical. If 4 times the amount of samples were needed, no savings would be experienced over the technique described above.

Raw data is received by the archiver recorder 93 (FIG. 10) in its full form of 16-bits for each value of raw X and 16-bits for each value of raw Y. The first X point (X$FIRST) and the first Y point (Y$FIRST) of each data type are each stored in its full form of 16-bits. Each additional X and Y is compressed into a total of one 8-bit byte for both X and Y. An X baseword of 16-bits is stored for a point as either X$FIRST or X$LAST; and a Y baseword of 16-bits is stored as either Y$FIRST or Y$LAST. The compression uses sign-magnitude and is done by doing the following:

1. X$DIFFERENCE$WORD=RAW$X−X$BASE$WORD
2. Clear X$COMPRESS$BYTE
3. If X$DIFFERENCE$WORD is less than 0 THEN set sign bit in X$COMPRESS$BYTE and 2's complement X$DIFFERENCE$WORD
4. If any bit 6 through 14 is set in X$DIFFERENCE$WORD THEN set data bits in X$COMPRESS$BYTE (bits 0, 1 & 2) ELSE move data bits from X$DIFFERENCE$WORD (bits 3, 4, & 5) to X$COMPRESS$BYTE (bits 0, 1 & 2)
5. Do the same for Y
6. Combine X$COMPRESS$BYTE & Y$COMPRESS$BYTE into compressed x-y byte called COMPRESS$X$Y The X part is bits 7, 6, 5, & 4. The Y part is bits 3, 2, 1, & 0. Bits 7 & 3 are sign bits with set (logic 1) being minus and clear (logic 0) being plus.

The compressed data is stored in one of the buffers CB1, CB2, MB1, MB2 of FIG. 11. The calibration buffers CB1, CB2 each have a capacity of 330 X and Y data points, and the monitor buffers MB1, MB2 each have a capacity of 1650 X and Y data points, but a greater or lesser amount of capacity can be used if needed.

The operation of the buffers can be more easily understood by assuming that five data points are to be loaded into five memory locations (locations A, B, C, D, E) in a circular data buffer. Each data point is represented by a compressed data byte containing one compressed X and one compressed Y.

BEFORE new RAW$X and Y arrives:

X$FIRST is the word value of the first x data point to be plotted and Y$FIRST is the word value of the first y data point to be plotted.

SECOND$DATA is a pointer to the second data point C (a compressed byte) to be plotted.

D is the third data point (a compressed byte) to be plotted.

E is the fourth data point (a compressed byte) to be plotted.

A is the second to last data point (a compressed byte) to be plotted.

B is the last data point (a compressed byte) to be plotted where B is the compressed version of words X$LAST & Y$LAST.

When a new raw X and raw Y arrive the process is as follows:

1. Using X$FIRST & Y$FIRST as bases, point C is expanded to a full set of words called C$FULL$X & C$FULL$Y using the expansion as explained below.

The EXPANSION is sign-magnitude and is done as follows:

A. Separate COMPRESS$X$Y into bits 3, 4, & 5 of X$WORK$WORD & Y$WORK$WORD. Do not copy sign bits.
B. If sign bit for x in COMPRESS$X$Y is plus THEN X$EXPANDED=X$BASE$WORD+X$WORK$WORD ELSE X$EXPANDED=X$BASE$WORD−X$WORK$WORD.
C. Do the same for y.

2. The following substitutions are then made: X$FIRST=C$FULL$X, Y$FIRST=C$FULL$Y 3. Using X$LAST & Y$LAST as bases, RAW$X & RAW$Y are compressed into one byte called COMPRESSED$X$Y. See how compression is done above.
4. Point C is replaced by COMPRESSED$X$Y, i.e., data (second$data)=compressed$x$y.
5. Using X$LAST & Y$LAST as bases COMPRESSED$X$Y is expanded to full words called EXPANDED$X & EXPANDED$Y.
6. The following substitutions are then made: X$LAST=EXPANDED$X, Y$LAST=EXPANDED$Y.
7. Increment second data pointer.

After a new raw x and new raw y have arrived:

X$FIRST$DATA is the word value of the first x data point to be plotted and Y$FIRST$DATA is the word value of the first y data point to be plotted.

SECOND$DATA is a pointer to the second data point (a compressed byte) to be plotted. It is now pointing to data point D.

E is the third data point (a compressed byte) to be plotted.

C is the last data point (a compressed byte) to be plotted. C is the compressed version of words X$LAST & Y$LAST.

B is the second to the last data point (a compressed byte) to be plotted.

A is the third to the last data point (a compressed byte) to be plotted.

While the process of recording monitor data is going on, the fluid pound detector will start its calibration. At this time the fluid pound detector (FIG. 10, 91) sends a "start calibration recording" message to the archiver supervisor. The archiver supervisor (FIG. 12 at R) passes this request on to the recorder. When this request is received by the recorder (FIG. 13 at C), the last X value stored in the monitor buffer is copied to the first X and last X locations of the calibration buffer and the last Y value stored in the monitor buffer is copied to the first X and last X locations of the calibration buffer. The state is then changed to the "calibration monitor store data" state. In this state, when an X value is received it is saved in temporary memory as always. When a Y value is received (FIG. 13, at BB), the X and Y values are compressed as described above and are stored in the calibration as well as the monitor buffers, that is, two recordings are being made simultaneously.

At the end of the calibration period, the fluid pound detector sends a "stop calibration recording" message to the archiver supervisor and the archiver supervisor (FIG. 12 at S), passes this message to the recorder. The recorder, when it receives the "stop calibration recording" message (FIG. 13 at G) requests, as before, key parameters from other state machines in the system. Once these requests are made, the recorder moves to the "calibration monitor get parameters" state (FIG. 13, 6) to await receipt of the requested parameters. As each requested parameter is received (FIG. 13 at 0), it is identified and then placed in a location of the calibration buffer header (FIG. 11) reserved for it and conversion from engineering units to analog-to-digital converter counts is done if needed. When all the requested parameters have been received and saved in the calibration buffer header memory, the state is changed back to monitor store data (FIG. 13, 4) and a "switch calibration buffers" message is sent to the archiver supervisor. In other words, we have completed the calibration recording and have returned to recording only on the monitor "tape". When the archiver supervisor receives the "switch calibration buffers" message (FIG. 12 at X), the calibration buffers are switched. The current calibration recording buffer becomes the calibration playback buffer and the playback buffer becomes the new recording buffer. The new recording buffer is initialized by placing default values in its header and zeros everywhere else in the buffer. Now, the most recent calibration "tape" is ready for playback and the previous playback "tape" is erased and is ready for a new calibration recording.

At the point when it has detected or has been informed that the pump motor has turned off, the fluid pound detector sends a "stop monitor recording message" to the archiver supervisor, which (FIG. 12 at U) passes this request to the recorder. If the pump stops during the calibration period, a "stop calibration recording" followed by a "stop monitor recording" is sent to the recorder. If both messages are sent then the recorder follows the path from state 5 to 6 to 7 to 1 (FIG. 13).

If the "stop monitor recording" message is received before all the calibration header parameters are received, the path from 5 to 6 to 4 to 1 is followed. If, as is usually the case, the "stop monitor recording" is received at some time after calibration (FIG. 13 at H), then the path from 4 to 1 is taken. As indicated in FIG. 13, the end result of this process is that a "switch monitor buffers" or a "switch calibration buffers" and a "switch monitor buffers" message are sent to the supervisor. The supervisor responds by switching the appropriate buffers as previously described. Monitor as well as calibration historical data is now available for playback and clean "tapes" are available for recording.

In order to playback a set of historical calibration dynagraphs or a set of historical monitor dynagraphs, it is necessary to connect the plotter controller (3B) to the motor controller (3A) by means of the serial communication line or other appropriate means (a serial line is not required). FIG. 10 shows the interface of plotter state machines 95-98 to the controller state machines and shows the interrelationship of the machines 95-98. This representation discloses one method of obtaining a record of the "tapes" previously stored in memory as discussed hereinbefore. However, other methods of using the present invention can also be utilized.

When power is turned on in the computer of FIG. 3B, "power on" messages are sent to the plotter state machines 95-98 (FIG. 10) and these machines are initialized. The plot supervisor 95 in the plotter controls plotting by monitoring the plot keys on the keyboard 60 (FIG. 1) and responds with the necessary messages to satisfy the requests keyed into the computer. Each time the plot supervisor sends out a message to the controller archiver supervisor 92 (FIG. 10) a response timer is set. If the response timer times out before the plot supervisor 95 receives an answer to its message, a communication line failure is noted and the plotter is reinitialized. The motor controller archiver supervisor 92 (FIG. 10) is subordinate to the plotter plot supervisor 95.

The human operator initiates memory plotting by pressing appropriate keys on the keyboard 60 (FIG. 1) to start calibration or shutdown replay. The calibrate replay function causes the data stored in the calibration "tape" to be sent to the XY plotter which plots it. The shutdown reply function causes the data stored in the shutdown (monitor) "tape" to be plotted on the XY plotter 59 (FIG. 1).

Some of the messages which are sent by the plotter plot supervisor 95 (FIG. 10) to the controller archiver supervisor 92 as a result of the operation of a keyboard 60 (FIGS. 1, 3B) plot function key operation are:
(1) plot calibration
(2) plot monitor
(3) pause
(4) continue The archiver playback machine 94 (FIG. 10) handles all output communication with the plotter in regard to historic plotting. When the plot button (not shown) on the keyboard 60 (FIGS. 1, 3B) is pushed the archiver playback machine 94 receives a plot calibration or plot monitor message from the archiver supervisor 92 along with a pointer to the current playback buffer. The playback machine sends the plot parameters and the first X and Y data points to the data distributor 98 and then goes into the pause mode. The playback machine 94 sends the plot parameter set preceded by a start parameter message and ends with a line OK message to the data distributor 98.

The grid is plotted first and includes plotting the following plot parameters:
(1) minimum and maximum X and Y values in the form of a rectangle.
(2) X and Y set points (one solid vertical line and one solid horizontal line.

When the grid plotter 96 has finished plotting the grid, it sends a "grid done" message to the plot supervisor 95 which sends a "get ready" message to the data plotter 97. When the data plotter is ready to receive data, it sends a ready message back to the plot supervisor 95 which sends a continue message to the archiver supervisor 92.

When the playback machine 94 (FIG. 10) receives a "continue" message, it sends the data from the selected buffer (either calibration or monitor) to the data distributer 98. When the data is being expanded during playback, the X and Y last data are used to store the values of the last expanded X and Y and are used as a base for the expansion of the next X and Y. The expanded X and Y values are then smoothed using the math utility before this data is sent to the data distributor 98. The playback buffer uses the system timer 84b (FIG. 3B) to clock data sent to the data distributor 98. A pause message to the archiver playback machine 94 stops the flow of data until a "continue" message is received.

The data distributor 98 (FIG. 10) receives plot parameters and XY data values in controller analog-to-digital counts from the archiver 94, converts them into plotter digital-to-analog counts, and makes them available for other machines in the plotter. When the historical plot data has all been sent, the playback machine 94 sends a "plot done" message to the data distributor 98 and the distributor passes these plot done messages onto the data plotter 97 and to the plot supervisor 95.

In addition to its interface to the recorder as previously described, when the archiver supervisor 92 (FIG. 10) receives a "stop calibration recording" message from the fluid pound detector 91, indicating that the calibration period is over, it passes this message on to the playback machine 94. If an historic calibration is being played back, a "plot done" message will be sent to the data distributor 98, terminating the plot. The same action is taken for a "stop monitor recording" message. This is necessary and is the only limitation of the record/playback system. If the current calibration period ends while an historic calibration dynagraph is being transmitted, this transmission will be cut short since the playback and record buffers have to be switched at this time. The same applies to the monitor (shut down) historic dynagraph playback.

Although the best mode contemplated for carrying out the present invention has been herein shown and described, it will be apparent that modification and variation may be made without departing from what is regarded to be the subject matter of the invention.

What is claimed is:

1. Apparatus for recording and playback of dynagraphs in a well pumping unit having a deep well pump connected to a sucker-rod string and a power unit to reciprocate said rod string to produce fluid from an underground location, said apparatus comprising:
   first transducer means for generating a signal representative of a load on said rod string;
   second transducer means for generating a signal representative of a position of said rod string;
   means for continuously storing said load signals and said position signals on an endless loop memory during operation of said pumping unit;
   means for halting said signal storage upon the occurrence of a fault which causes the shutdown of said pumping unit; and
   means for using said store load signals and said stored position signals to analyze well conditions using signals stored on said loop memory during a predetermined period of time prior to the occurrence of a fault which caused a shutdown of said pumping unit.

2. Apparatus as defined in claim 1 wherein said means for storing includes a first endless loop memory for storing said load signals and said position signals during a calibration period following start up of well operation, and a second endless loop memory for continously storing said load signals and said position signals during well operation.

3. Apparatus as defined in claim 2 including means for halting the storage of said load signals and said position signals when said well operation is interrupted to save the load and position signals stored immediately prior to well shutdown.

4. Apparatus as defined in claim 1 wherein said using means includes an XY plotter and means for coupling said stored load signals and said stored position signals to said plotter to produce a dynagraph representing the operation of said well pumping unit prior to shutdown of said pumping unit.

5. Apparatus as defined in claim 1 wherein said storage means includes a first pair of endless loop memories for storing said load and said position signals generated during a calibration period, means for writing data into one of said first pair and for simultaneously reading data from the other of said first pair; a second pair of endless loop memories for storing data generated during a well operation period, means for writing data into one of said second pair and for simultaneously reading data from the other of said second pair of said memories.

6. Apparatus as defined in claim 2 including means for compressing said load signals and said position signals prior to storage to increase the number of signals that can be stored in said storage means.

7. Apparatus as defined in claim 2 including means for using base-offset low fidelity data compression to compress said load signals and said position signals prior to placing said signals in one of said memories.

8. Apparatus as defined in claim 2 including means for periodically sampling said load signals and said position signals and for converting said sampled signals into digital data words, means for storing a first data word as a base value, means for subtracting said base value from a second data word to obtain a difference value and for storing a shortened portion of the difference value in one of said memories as a compressed word.

9. Aparatus as defined in claim 8 including means for subtracting each of said subsequent data words from the immediately previous data word to obtain a difference value, and means for storing a shortened portion of the difference value as a compressed word.

10. A method for recording and playback of dynagraphs generated in a well having a sucker-rod string connected to a deep well pump with a first transducer generating a signal representative of a load on the rod string and a second transducer generating a signal representative of a position of the rod string, for sue with a digital computer having a plurality of memory locations, said method comprising the steps of:
    sampling the values of said load signal and said position signal,
    storing said sampled signals sequentially in a plurality of memory locations of an endless loop memory while said well pump is operating,
    retaining said stored signals in said memory locations when operation of said well pump is halted, and
    using said stored signals to analyze a fault which causes operation of said well pump to be halted.

11. A method as defined in claim 10 including the further steps of:
    retrieving said stored signals from said memory, and
    using said retrieved signals to plot a dynagraph showing performance of said well at a time prior to the halting of pump operation.

* * * * *